(12) United States Patent
Nakagawa et al.

(10) Patent No.: US 9,034,198 B2
(45) Date of Patent: May 19, 2015

(54) PLASMA ETCHING METHOD (75) Inventors: Akira Nakagawa, Gyeonggi-Do (KR);
Fumio Yamazaki, Miyagi (JP); Hiromi Mochizuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/235,857

(22) PCT Filed: Jul. 30, 2012

(86) PCT No.: PCT/JP2012/069375
§ 371 (c)(1),
(2), (4) Date: Jan. 29, 2014

(87) PCT Pub. No.: WO2013/018776
PCT Pub. Date: Feb. 7, 2013

(65) Prior Publication Data
US 2014/0144876 A1 May 29, 2014

Related U.S. Application Data (60) Provisional application No. 61/523,434, filed on Aug. 15, 2011.

(30) Foreign Application Priority Data

Aug. 2, 2011 (JP) .................................. 2011-169296

(51) Int. Cl.
*H05H 1/46* (2006.01)
*H01L 21/3065* (2006.01)
(Continued)

(52) U.S. Cl.
CPC ............ *H05H 1/46* (2013.01); *H01L 21/67069*
(2013.01); *H01L 21/02164* (2013.01); *H01L 21/32137* (2013.01); *H01L 21/3065* (2013.01);
(Continued)

(58) Field of Classification Search
CPC ..................... H01L 21/3065; H01L 21/67069;
H01L 21/32137; H01L 21/02164
See application file for complete search history.

(56) References Cited

U.S. PATENT DOCUMENTS 5,888,309 A * 3/1999 Yu .................................. 134/1.2
8,133,819 B2 * 3/2012 Wang et al. .................... 438/725
(Continued)

FOREIGN PATENT DOCUMENTS

JP 2003-347281 12/2003
JP 2006-278436 10/2006
(Continued)

*Primary Examiner* — Duy Deo
(74) *Attorney, Agent, or Firm* — IPUSA, PLLC (57) ABSTRACT A plasma etching method using a plasma etching apparatus including a lower electrode and an upper electrode is provided. The plasma etching method includes a first etching step of performing plasma etching using a first process gas and a second etching step of performing the plasma etching using a second process gas. The adhesion of a radical of the second process gas to an object of processing is less than the adhesion of a radical of the first process gas to the object of processing. While alternately repeating a first condition of turning on high-frequency electric power for plasma generation and a second condition of turning off the high-frequency electric power, the second etching step applies a negative direct-current voltage to the upper electrode so that the absolute value of the applied voltage is greater in a period of the second condition than in a period of the first condition.

4 Claims, 9 Drawing Sheets

(a)

(b)

(51) Int. Cl.
*H01L 21/311* (2006.01)
*H01J 37/32* (2006.01)
*H01L 21/67* (2006.01)
*H01L 21/02* (2006.01)
*H01L 21/3213* (2006.01)

(52) U.S. Cl.
CPC .... *H01L 21/31116* (2013.01); *H01L 21/31144* (2013.01); *H01J 37/32091* (2013.01); *H01J 37/32165* (2013.01); *H01J 2237/334* (2013.01)

(56) References Cited

U.S. PATENT DOCUMENTS

| | | | |
|---|---|---|---|
| 2010/0190350 A1* | 7/2010 | Yatsuda et al. | 438/710 |
| 2010/0213162 A1* | 8/2010 | Mochiki et al. | 216/17 |

FOREIGN PATENT DOCUMENTS

| | | |
|---|---|---|
| JP | 2008-244144 | 10/2008 |
| JP | 2010-219491 | 9/2010 |

* cited by examiner

<TABLE 1>

| | FIRST HIGH-FREQUENCY POWER SUPPLY OUTPUT : 500W, HIGH-FREQUENCY POWER SUPPLY PULSE INTERVAL : 10kHz | FIRST HIGH-FREQUENCY POWER SUPPLY OUTPUT : 500W, HIGH-FREQUENCY POWER SUPPLY PULSE INTERVAL : 20kHz | FIRST HIGH-FREQUENCY POWER SUPPLY OUTPUT : 1700W, HIGH-FREQUENCY POWER SUPPLY PULSE INTERVAL : 10kHz | FIRST HIGH-FREQUENCY POWER SUPPLY OUTPUT : 1700W, HIGH-FREQUENCY POWER SUPPLY PULSE INTERVAL : 20kHz |
|---|---|---|---|---|
| SYNCHRONIZATION PULSE (Ar FLOW RATE: 275sccm) | 4.8 | 4.5 | 3.7 | 3.8 |
| DC SYNCHRONIZATION PULSE (Ar FLOW RATE: 275sccm) | 4.8 | 4.7 | 4.0 | 4.0 |
| SYNCHRONIZATION PULSE (Ar FLOW RATE: 550sccm) | — | — | 3.9 | 4.0 |
| DC SYNCHRONIZATION PULSE (Ar FLOW RATE: 550sccm) | — | — | 4.2 | 4.8 |

PLASMA ETCHING METHOD

CROSS-REFERENCE TO RELATED APPLICATIONS

This application is a National Stage of International Application No. PCT/JP2012/069375, filed on Jul. 30, 2012, claiming priority based on Japanese Patent Application No. 2011-169296, filed on Aug. 2, 2011, and claiming benefit of U.S. Provisional Application No. 61/523,434, filed on Aug. 15, 2011, the entire contents of all of which are incorporated herein by reference in their entirety.

TECHNICAL FIELD

The present invention relates to plasma etching methods that perform plasma etching on substrates using a plasma.

BACKGROUND ART

For example, in semiconductor device manufacturing processes, a plasma etching process, which performs etching with a plasma using a resist as a mask, is frequently employed in order to form a predetermined pattern on a predetermined layer formed on a semiconductor wafer, which is an object of processing.

HARC (High Aspect Ratio Contact) etching of an aspect ratio of 20 or more has been demanded by recent progress in the microfabrication of semiconductor devices. Recently, high aspect ratio etching of an aspect ratio higher than 40 has been demanded as the next generation HARC.

In such HARC etching, an etching mask such as a photoresist is negatively charged, and electric charge is neutralized on the etched surface in the beginning of etching. When the aspect ratio becomes higher with the progress of etching, positive ions collect at the bottom of the hole, so that the etched surface becomes positively charged. Therefore, the positive ions are bent by repulsion in the hole, so that the etched shape is bent or distorted. Furthermore, shading damage may be caused by the bottom of the hole thus being positively charged. Furthermore, positive ions become less likely to reach the bottom of the hole, thus causing a decrease in the etch rate.

Therefore, Patent Document 1 or the like discloses a technique to neutralize the positively charged bottom of the hole by applying high frequency electric power for plasma generation in a pulsed manner and feeding as many secondary electrons as possible to the bottom of the hole.

PRIOR ART DOCUMENT

Patent Document

[Patent Document 1] Japanese Laid-Open Patent Application No. 2010-219491

SUMMARY OF THE INVENTION

Problems to be Solved by the Invention

According to the method of Patent Document 1, however, performing etching with a process gas having highly adhesive radicals for HARC etching has caused necking, thus resulting in reduction in the etch rate or the occurrence of bowing.

With respect to the above-described problem, a plasma etching method is provided that controls the occurrence of necking or bowing and has a high mask selection ratio at a high etch rate.

Means for Solving the Problems

In order to solve the above-described problem, according to an embodiment of the present invention, a plasma etching method using a plasma etching apparatus including a lower electrode that operates as a base for placing an object of processing and an upper electrode placed to face the lower electrode is provided. The plasma etching method includes a first etching step of performing plasma etching using a first process gas including a fluorocarbon gas and a second etching step of performing the plasma etching using a second process gas including a fluorocarbon gas. The adhesion of a radical of the second process gas to the object of processing is less than the adhesion of a radical of the first process gas to the object of processing. While alternately repeating a first condition of turning on high-frequency electric power for plasma generation and a second condition of turning off the high-frequency electric power, the second etching step applies a negative direct-current voltage to the upper electrode so that the absolute value of the applied voltage is greater in a period of the second condition than in a period of the first condition.

Effects of the Invention

According to the present invention, it is possible to provide a plasma etching method that controls the occurrence of necking and bowing and has a high mask selection ratio at a high etch rate.

DESCRIPTION OF EMBODIMENTS

A specific description is given below, with reference to the drawings, of embodiments of the present invention.
[Process Gas]

First, a description is given of process gases that may be used in the embodiments.

Figure 1:
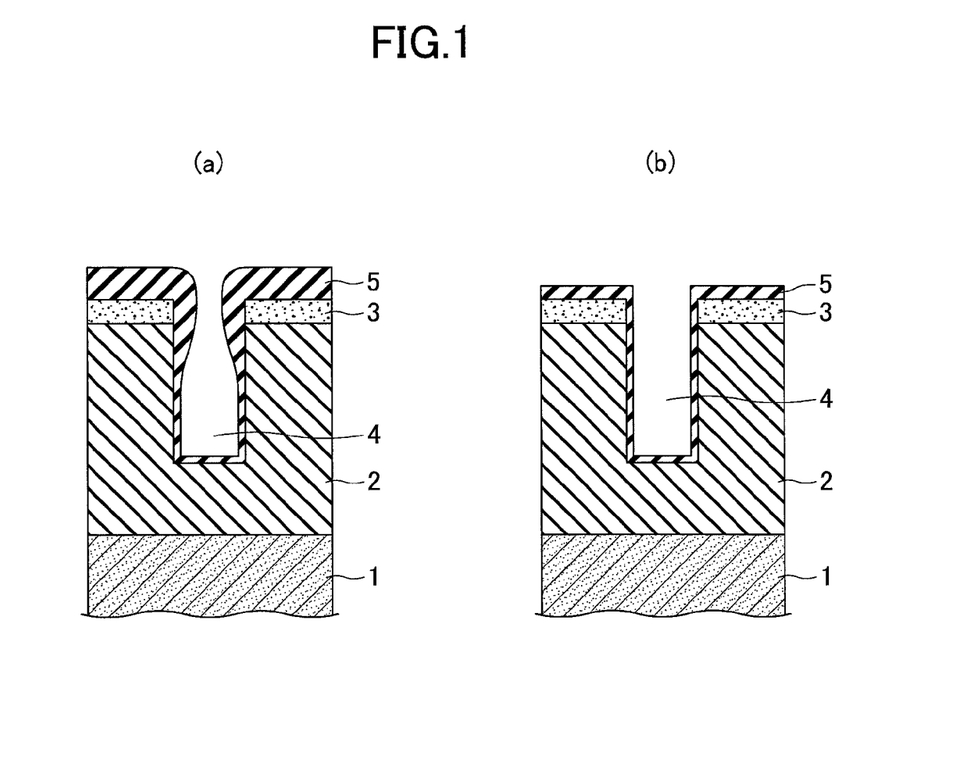
FIG. 1 is a schematic diagram for illustrating the correlation between the adhesion of a process gas and the shape of a hole, illustrating holes on which a protection film is formed.

FIG. 1 is a schematic diagram for illustrating the correlation between the adhesion of a process gas and the shape of a hole, illustrating holes on which a protection film is formed. The adhesion of radicals of a process gas used to an object of processing (that is, a film to be etched, for example, a substrate to be processed, an underlayer film, a hard mask such as an oxide film or a nitride film, an anti-reflection film or the like) differs between (a) of FIG. 1 and (b) of FIG. 1. The radicals of (a) of FIG. 1 are assumed to be more adhesive than the radicals of (b) of FIG. 1.

Furthermore, in FIG. 1, a description is given of a semiconductor wafer W having a structure where an insulating film 2 is formed as an object of processing on a Si substrate 1 and a photoresist film patterned by photolithography is formed as an etching mask 3 on the insulating film 2. The embodiments, however, are not limited to the structure of this semiconductor wafer W.

In (a) of FIG. 1, highly adhesive radicals are used. Therefore, a relatively thick protection film 5 is deposited on a surface of the etching mask 3 and a side surface of a hole 4. In the case of performing high aspect ratio contact hole etching (HARC etching), it is preferable to use highly adhesive radicals in order to ensure a high mask selection ratio. As the hole size decreases, however, the thickness of the protection film 5 generated on a side surface of the etching mask 3 increases, so that necking is likely to occur to close the hole entrance. This causes a shortage of the amount of ions entering the hole 4, which leads to at least one of reduction in the CD (critical dimension) of the bottom of the hole 4 and reduction in the etch rate. Furthermore, incident ions are reflected above the necking, so that bowing (the hollowing of a sidewall) may occur below the necking.

On the other hand, in (b) of FIG. 1, a process gas that generates radicals less adhesive than in the case of (a) of FIG. 1 is used to avoid the above-described necking. In the case of radicals of low adhesion, the protection film 5 on the etching mask 3 tends to adhere over a relatively wide area as a thin film. Therefore, plasma durability deteriorates compared with the above-described case, so that a sufficient mask selection ratio for performing HARC etching is not obtained.

Therefore, according to the embodiments, the process gas is changed at least once or more during a process time of plasma etching. At this point, in the beginning of etching (for example, a main etching process), a first process gas whose protection film is highly adhesive to a film to be etched is selected to increase a mask selection ratio at an etching time. Thereafter, at a later stage of etching (an over-etching process), a second process gas that causes a thin protection film to adhere to the interior sidewall of a hole is selected to perform plasma etching while suppressing the above-described necking. Causing plasma etching to progress with suppressed necking makes it possible to provide a hole with a good vertical shape even in an area of high aspect ratio. The timing of switching process gases depends on etching conditions, a desired aspect ratio, etc., and may be suitably selected by a person of ordinary skill in the art.

Process gases that may be preferably used in the embodiments are process gases including fluorocarbon gases. Fluorocarbon gases that may be used are not limited in particular, and may be, for example, CF, $CF_2$, $CF_3$, $CF_4$, $C_2F_4$, $C_2F_6$, $C_3F_8$, $C_4F_6$, $C_4F_8$, $C_4F_{10}$, $C_5F_8$ and other fluorocarbon gases ($C_xF_y$). One kind of fluorocarbon gas may be used alone or two or more kinds of fluorocarbon gases may be used in a mixture. Furthermore, for example, a gas containing argon gas and/or oxygen gas may be added to the above-described fluorocarbon gases. Addition of at least one of argon gas and oxygen gas increases electron temperature at an etching time. As the electron temperature increases, the degree of dissociation of radicals increases, so that the amount of radicals fed into the hole increases. As a result, it is possible to increase the deposition rate of a protection film.

The adhesion of the radicals of fluorocarbon gases to a film to be etched usually depends on the number of C to the number of F in one radical molecule (that is, C/F ratio). As the C/F ratio increases, the adhesion to a film to be etched increases. At this point, a process gas is selected in view of the dissociation of a process gas in accordance with etching time conditions (for example, temperature and residence time). By way of example, a description is given of the case of using $C_4F_6$ and $C_4F_8$ as fluorocarbon gases. $C_4F_6$ radicals are principally present as $C_4F_6$ radicals at normal etching temperatures with some being dissociated to $CF_x$. On the other hand, $C_4F_8$ radicals are generally dissociated at normal etching temperatures and principally present as $C_2F_4$ radicals. Therefore, in the beginning of plasma etching (for example, a main etching process), high-adhesion $C_4F_6$ is used as a first process gas to increase a selection ratio, and at a later stage of plasma etching (for example, an over-etching process), low-adhesion $C_4F_8$ is used as a second process gas to increase an etch rate although the selection ratio becomes lower than in the beginning of plasma etching.
[Plasma Etching Apparatus]

Figure 2:
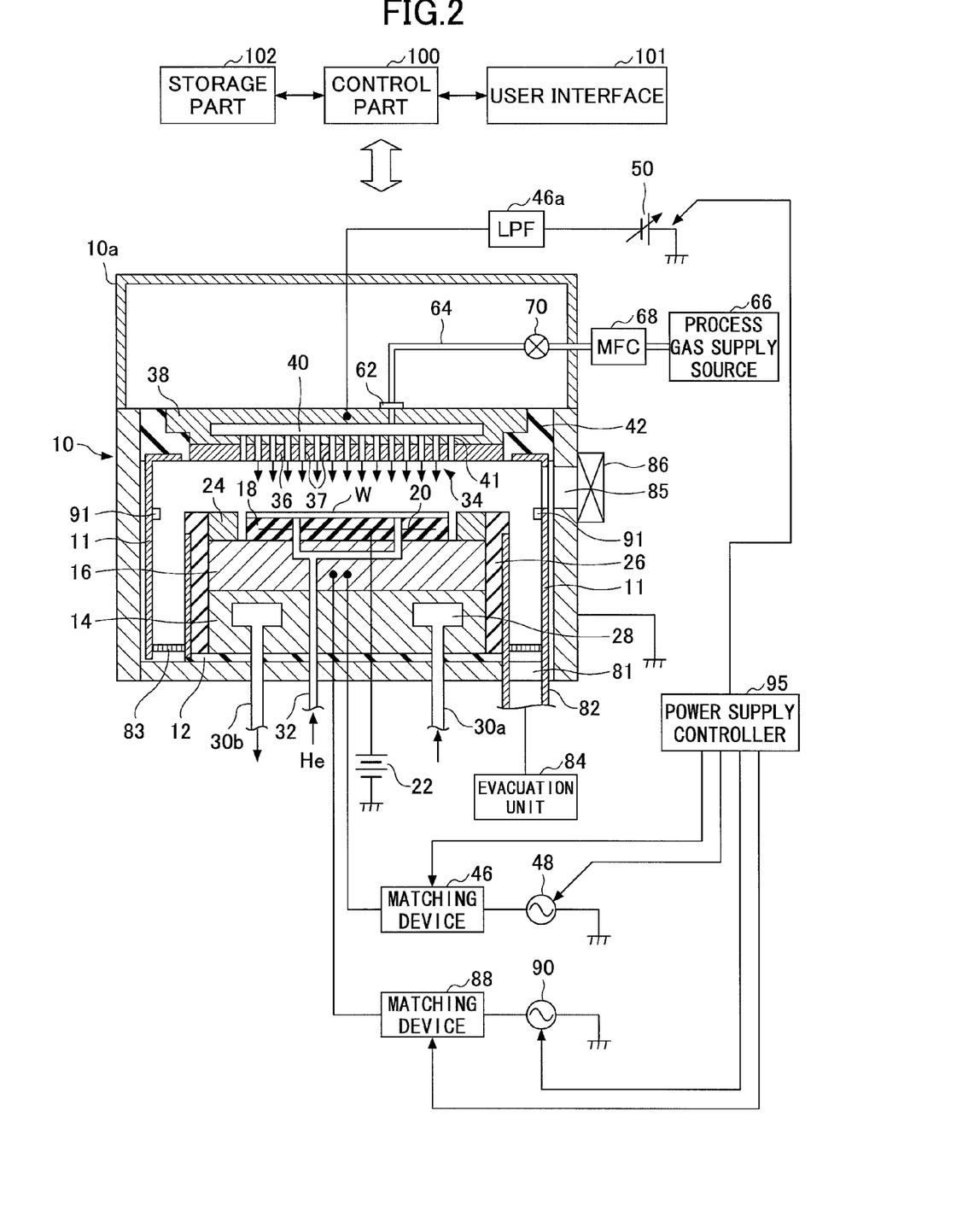
FIG. 2 is a schematic cross-sectional view illustrating a plasma etching apparatus capable of carrying out a plasma etching method according to an embodiment of the present invention.

Next, a description is given of a plasma etching apparatus of a first embodiment of the present invention. FIG. 2 is a schematic cross-sectional view illustrating a plasma etching apparatus capable of carrying out a plasma etching method according to the first embodiment of the present invention.

The plasma etching apparatus illustrated in FIG. 2 is configured as a capacitive coupled parallel plate plasma etching apparatus, and includes, for example, a substantially cylindrical aluminum chamber (processing container) 10 having an anodized surface. This chamber 10 is grounded for protection.

A columnar susceptor support base 14 is placed on the bottom of the chamber 10 through an insulating plate 12 formed of ceramics or the like. A susceptor 16 formed of, for example, aluminum is provided on this susceptor support base 14. The susceptor 16 forms a lower electrode, over which a semiconductor wafer W, which is an object of processing, is placed.

An electrostatic chuck 18 that attracts and holds the semiconductor wafer W by an electrostatic force is provided on an upper surface of the susceptor 16. This electrostatic chuck 18 has a structure where an electrode 20 formed of a conductive film is held between a pair of insulation layers or insulation sheets. A direct-current power supply 22 is electrically connected to the electrode 20. The semiconductor wafer W is attracted to and held by the electrostatic chuck 18 by an electrostatic force such as a Coulomb force generated by a direct-current voltage from the direct-current power supply 22.

A conductive focus ring (correction ring) 24 formed of, for example, silicon for improving etching uniformity is placed on the upper surface of the susceptor 16 around the electrostatic chuck 18 (the semiconductor wafer W). A cylindrical inner wall member 26 formed of, for example, quartz is provided on side surfaces of the susceptor 16 and the susceptor support base 14.

A refrigerant chamber 28 is provided, for example, a circumferentially inside the susceptor support base 14. A refrigerant such as cooling water at a predetermined temperature is supplied in a circulatory manner to this refrigerant chamber 28 from an externally provided chiller unit, which is not graphically represented, through pipes 30a and 30b. The process temperature for the semiconductor wafer W over the susceptor 16 may be controlled by changing the temperature of this refrigerant.

Furthermore, a heat transfer gas such as He gas from a heat transfer gas supply mechanism, which is not graphically represented, is supplied between an upper surface of the electrostatic chuck 18 and a bottom surface of the semiconductor wafer W through a gas supply line 32.

An upper electrode 34 is provided above and parallel to the susceptor 16, which is a lower electrode, so as to face the susceptor 16. A space between the upper and lower electrodes 34 and 16 serves as a plasma generation space. The upper electrode 34 forms a surface that faces the semiconductor wafer W on the susceptor 16, which is a lower electrode, and comes into contact with the plasma generation space, that is, an opposite surface.

This upper electrode 34 is supported in an upper part of the chamber 10 through an insulating shielding member 42. Furthermore, the upper electrode 34 includes an electrode plate 36, which forms the opposite surface to the susceptor 16 and includes numerous gas ejection holes 37, and an electrode support 38 having a water-cooled structure, which removably supports this electrode plate 36 and is formed of a conductive material such as aluminum. The electrode plate 36 is preferably a low-resistance conductor or semiconductor of a low Joule heat. Furthermore, as mentioned below, the electrode plate 36 is preferably a substance containing silicon in view of resist reinforcement. From these viewpoints, the electrode plate 36 is preferably formed of silicon or SiC. A gas diffusion chamber 40 is provided inside the electrode support 38. Numerous gas flow holes 41 that communicate with the gas ejection holes 37 extend downward from this gas diffusion chamber 40.

A gas introduction port 62 that introduces a process gas into the gas diffusion chamber 40 is formed in the electrode support 38. A gas supply pipe 64 is connected to this gas introduction port 62. A process gas supply source 66 is connected to the gas supply pipe 64. The process gas supply source 66 is controlled by a control part 100. Multiple kinds of process gases may be supplied in a predetermined amount for a predetermined time in accordance with a process. A mass flow controller (MFC) 68 and an opening and closing valve 70 are provided in order from the upstream side in the gas supply pipe 64, so that the amount of a process gas supplied may be controlled (the MFC may be replaced with an FCS). As process gases for etching, for example, the above-described process gases reach the gas diffusion chamber 40 from the process gas supply source 66 through the gas supply pipe 64 to be ejected into the plasma generation space in a shower through the gas flow holes 41 and the gas ejection holes 37. That is, the upper electrode 34 operates as a shower head for supplying a process gas.

A variable direct-current power supply 50 is electrically connected to the upper electrode 34 through a low-pass filter (LPF) 46a. The variable direct-current power supply 50 is connected so that the negative electrode is on the upper electrode 34 side to apply a negative (minus) voltage to the upper electrode 34. The low-pass filter (LPF) 46a, which traps high frequencies from below-described first and second high-frequency power supplies, is preferably formed of an LR filter or an LC filter.

A cylindrical ground conductor 10a is provided so as to extend from the sidewall of the chamber 10 to be positioned higher than the upper electrode 34.

Figure 3:
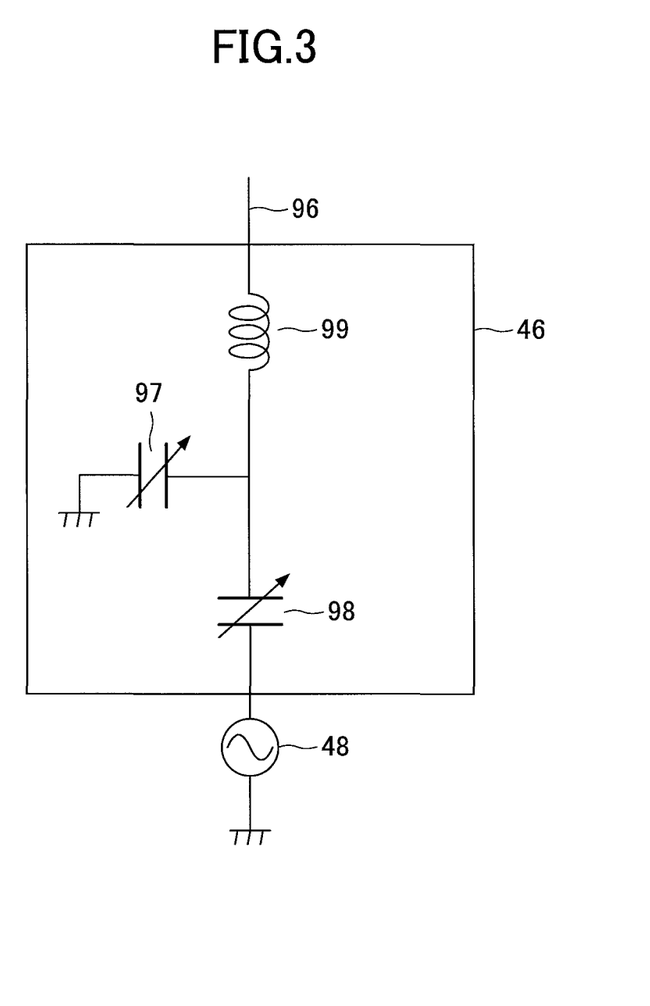
FIG. 3 is a diagram illustrating a structure of a first matching device connected to a first high-frequency power supply in the plasma etching apparatus of FIG. 2.

A first high-frequency power supply 48 for plasma generation is electrically connected to the susceptor 16, which is a lower electrode, through a first matching device 46. The first high-frequency power supply 48 outputs high-frequency electric power of a frequency of 27 to 100 MHz, for example, 40 MHz. The first matching device 46, which matches load impedance with the internal (or output) impedance of the first high-frequency power supply 48, operates so that the output impedance of the first high-frequency power supply 48 and the load impedance including a plasma inside the chamber 10 apparently match when a plasma is generated in the chamber 10. As illustrated in FIG. 3, the first matching device 46 includes a first variable capacitor 97, provided to branch from a power feed line 96 of the first high-frequency power supply 48, a second variable capacitor 98, provided on the first high-frequency power supply 48 side of the branch point in the power feed line 96, and a coil 99, provided on the opposite side of the branch point in the power feed line 96.

A second high-frequency power supply 90 also is electrically connected to the susceptor 16 via a second matching device 88. High-frequency electric power is supplied to the susceptor 16, which is a lower electrode, from this second high-frequency power supply 90, so that a bias is applied to the semiconductor wafer W to draw ions into the semiconductor wafer W. The second high-frequency power supply 90 outputs high-frequency electric power of a frequency ranging from 400 kHz to 13.56 MHz, for example, 3 MHz. The second matching device 88, which matches load impedance with the internal (or output) impedance of the second high-frequency power supply 90, operates so that the output impedance of the second high-frequency power supply 90 and the load impedance including a plasma inside the chamber 10 apparently match when the plasma is generated in the chamber 10.

The variable direct-current power supply 50, the first high-frequency power supply 48, the second high-frequency power supply 90, the first matching device 46, and the second matching device 88 are electrically connected to a power supply controller 95, and are controlled by the power supply controller 95.

The power supply controller 95 is capable of controlling the on/off and output of the first high-frequency power supply 48. To be more specific, the first high-frequency power supply 48 may be controlled to a state where the first high-frequency power supply 48 is continuously on to generate a plasma and to a state where the first high-frequency power supply 48 is alternately turned on and off to, for example, pulsate, so that a state where a plasma is present and a state where a plasma has disappeared are alternately formed. Likewise, the on/off and output of the second high-frequency power supply 90 for biasing may also be controlled. A state where a bias is continuously applied at predetermined output during plasma processing and controlling the output, for example, pulsed output, of the second high-frequency power supply 90 in synchronization with the on/off of the first high-frequency power supply 48 are possible. Furthermore, the power supply controller 95 is capable of performing on/off control and current/voltage control of the variable direct-current power supply 50.

In the case of this embodiment, unlike usual plasma etching, when the first high-frequency power supply 48 is in a mode where the high-frequency electric power is turned on and off at predetermined intervals, the power supply controller 95 performs control so that the matching operation in the first matching device 46 is switched in synchronization with this on and off.

In this case, if the variable capacitors 97 and 98 cannot follow the on/off at the time of causing the first high-frequency electric power supply 48 to operate in the on/off mode, it is preferable for the power supply controller 95 to perform control so that the first matching device 46 is not operated. The second matching device 88 is basically configured the same as the first matching device 46, and if the variable capacitors cannot follow the on/off at the time of controlling the output of the second high-frequency power supply 90 in synchronization with the on/off of the first high-frequency power supply 48, it is preferable for the power supply controller 95 to perform control so that the second matching device 88 is not operated.

If the variable capacitors of the first matching device 46 and the second matching device 88 operate sufficiently fast, however, control may be performed such that the first matching device 46 operates so that the internal impedance of the first high-frequency power supply 48 and load impedance including a plasma inside the chamber 10 match and the second matching device 88 operates so that the internal impedance of the second high-frequency power supply 90 and the load impedance including the plasma inside the chamber 10 match at the time of high output.

An evacuation port 81 is provided at the bottom of the chamber 10. An evacuation unit 84 is connected to this evacuation port 81 through an evacuation pipe 82. The evacuation unit 84 includes a vacuum pump such as a turbomolecular pump and is capable of reducing the pressure inside the chamber 10 to a desired degree of vacuum. Furthermore, a transfer port 85 for the semiconductor wafer W is provided in the sidewall of the chamber 10. This transfer port 85 may be opened and closed with a gate valve 86. Furthermore, a deposition shield 11 is removably provided along an inner wall of the chamber 10 in order to prevent adhesion of an etching byproduct (deposit) to the chamber 10. That is, the deposition shield 11 forms a chamber wall. Furthermore, the deposition shield 11 is also provided on a periphery of the inner wall member 26. An evacuation plate 83 is provided between the deposition shield 11 on the chamber wall side and the deposition shield 11 on the inner wall member 26 side in a bottom part of the chamber 10. An aluminum material coated with ceramics such as $Y_2O_3$ may be suitably used as the deposition shield 11 and the evacuation plate 83.

A conductive member (GND block) 91 DC-connected to ground is provided on a portion of part of the deposition shield 11 forming the chamber inner wall at substantially the same level as the wafer W. This produces an abnormal discharge prevention effect. The position of this conductive member 91 is not limited to the position of FIG. 2 as long as the conductive member 91 is provided in a plasma generation region. For example, the conductive member 91 may be provided on the susceptor 16 side, such as around the susceptor 16, or may be provided near the upper electrode 34, such as provided annularly outside the upper electrode 34.

The individual components (for example, the power supply system, the gas supply system, the drive system, the power supply controller 95 and so on) of the plasma processing apparatus are connected to and controlled by the control part (general control unit) 100 including a microprocessor (computer). Furthermore, a user interface 101, which includes a keyboard on which an operator performs operations to input commands to manage the plasma processing apparatus and a display that visualizes and displays the operating state of the plasma processing apparatus, is connected to the control part 100.

Furthermore, a storage part 102, which contains a control program for implementing, by the control of the control part 100, various kinds of processes executed in the plasma processing apparatus and programs for causing the individual components of the plasma processing apparatus to execute processes in accordance with process conditions (that is, process recipes), is connected to the control part 100. The process recipes are stored in a storage medium in the storage part 102. The storage medium may be a hard disk, a semiconductor memory, or a portable one such as a CDROM, DVD or flash memory. Furthermore, the recipes may be suitably transmitted from another apparatus via, for example, a dedicated line.

A process in the plasma processing apparatus is executed under the control of the control part 100 by calling a process recipe from the storage part 102 by an instruction from the user interface 101 or the like and causing the control part 100 to execute the process recipe as required.

[Plasma Etching Method]

Next, a description is given of a plasma etching method according to the first embodiment, performed using the above-mentioned process gases and plasma etching apparatus.

In the plasma etching method according to the first embodiment, a description is given of the case where the semiconductor wafer W having a structure in which an insulating film is formed on a Si substrate and a hard mask film, which is an etching mask, is formed on the insulating film is prepared as an object of processing and plasma etching is performed on the insulating film. The present invention, however, is not limited to this.

In the plasma etching process, first, the gate valve 86 is opened, and the semiconductor wafer W of the above-described configuration is transferred into the chamber 10 through the transfer port 85 and is placed on the susceptor 16. In this state, the gate valve 86 is closed, and a first process gas is supplied from the process gas supply source 66 to the gas diffusion chamber 40 at a predetermined flow rate while evacuating the chamber 10 with the evacuation unit 84. Furthermore, the pressure inside the chamber 10 is set to a value in a range of, for example, 0.75 to 113 mTorr while supplying the first process gas into the chamber 10 through the gas flow holes 41 and the gas ejection holes 37. Then, plasma etching is performed on the wafer W by applying predetermined high-frequency electric power and a direct-current voltage. At this point, the semiconductor wafer W is fixed to the electrostatic chuck 18 by applying a direct-current voltage from the direct-current power supply 22 to the electrode 20 of the electrostatic chuck 18.

As a first etching process of the plasma etching method of this embodiment, usually, first high-frequency electric power for plasma generation of a frequency of 27 to 100 MHz is applied from the first high-frequency power supply 48 using the highly adhesive first process gas. Furthermore, second high-frequency electric power for drawing ions of a frequency of 400 kHz to 13.56 MHz is applied from the second high-frequency power supply 90. Examples of possible frequencies of the first high-frequency electric power and the second high-frequency electric power may be 27 MHz, 40 MHz, 60 MHz, 80 MHz and 100 MHz as the first high-frequency electric power and 400 kHz, 800 kHz, 1 MHz, 2 MHz, 3 MHz, 13 MHz and 13.56 MHz as the second high-frequency electric power, which may be used in appropriate combinations in accordance with a process. Therefore, the present invention is not limited in this respect.

The first process gas ejected from the gas ejection holes 37 formed in the electrode plate 36 of the upper electrode 34 is converted into a plasma in a glow discharge between the upper electrode 34 and the susceptor 16, which is a lower electrode, created by the high-frequency electric power. The insulating film of the semiconductor wafer W is etched by positive ions or radicals generated in this plasma, using the hard mask film as an etching mask.

At this point, a plasma may be created at a position closer to the wafer W by applying the high-frequency electric power for plasma formation to the lower electrode. Furthermore, a plasma is prevented from diffusing over a wide area and it is possible to suppress the dissociation of the process gas. Therefore, it is possible to increase an etch rate even under conditions such as a high pressure inside the chamber 10 and a low plasma density. Furthermore, it is possible to ensure relatively high ion energy even in the case of a high frequency of the high-frequency electric power for plasma formation. Furthermore, by separately applying the high-frequency electric power for plasma formation and the high-frequency electric power for drawing ions to the lower electrode as in this embodiment, it is possible to control a plasma forming function and an ion drawing function, which are necessary for plasma etching, independent of each other. Accordingly, it is possible to satisfy conditions for etching of which high microfabricability is required. Furthermore, because high-frequency electric power in a high frequency domain higher than or equal to 27 MHz is supplied for plasma generation, it is possible to increase the density of a plasma in a preferred condition and to generate a high-density plasma even under a lower pressure condition.

Furthermore, because a negative direct-current voltage is applied from the variable direct-current power supply 50 to the upper electrode 34 when a plasma is formed, positive ions in the plasma collide with the upper electrode 34 so that secondary electrons are generated in its neighborhood. The generated secondary electrons are accelerated vertically downward, and the accelerated secondary electrons (fast electrons) are supplied to the semiconductor wafer W, which is an object of processing.

Etching progresses with positive ions in the plasma being dominant. In the beginning of etching in the first etching process, a contact hole formed by etching is shallow, so that electrons reach an etched surface and electric charge is neutralized even when the etched surface is supplied with positive ions. Accordingly, etching progresses normally.

As the aspect ratio of the contact hole becomes higher with the progress of etching, electrons become less likely to arrive inside the contact hole. As a result, positive ions collect inside the contact hole, so that the etched surface becomes positively charged. Because highly adhesive radicals are used in the first etching process, a relatively thick protection film is formed on the surface of the etching mask and the side surface of the hole as etching progresses. If etching is let to progress as is, positive ions that have entered the contact hole for etching are bent by the repulsion between the positive ions and positive electric charge in the contact hole, so that the etched shape is bent or distorted. Furthermore, shading damage is likely to be caused by positive ions at the bottom of the contact hole. Furthermore, positive ions become less likely to reach the bottom of the hole, thus causing a decrease in the etch rate. In particular, in the case of forming a contact hole having an aspect ratio of more than 40, which is an HARC, such drawbacks become conspicuous.

Therefore, in this embodiment, a second etching process of the plasma etching method, which suppresses necking, is performed by switching the first process gas supplied in the first etching process to a second process gas, which causes a protection film to thinly adhere to the interior sidewall of the hole.

Figure 4:
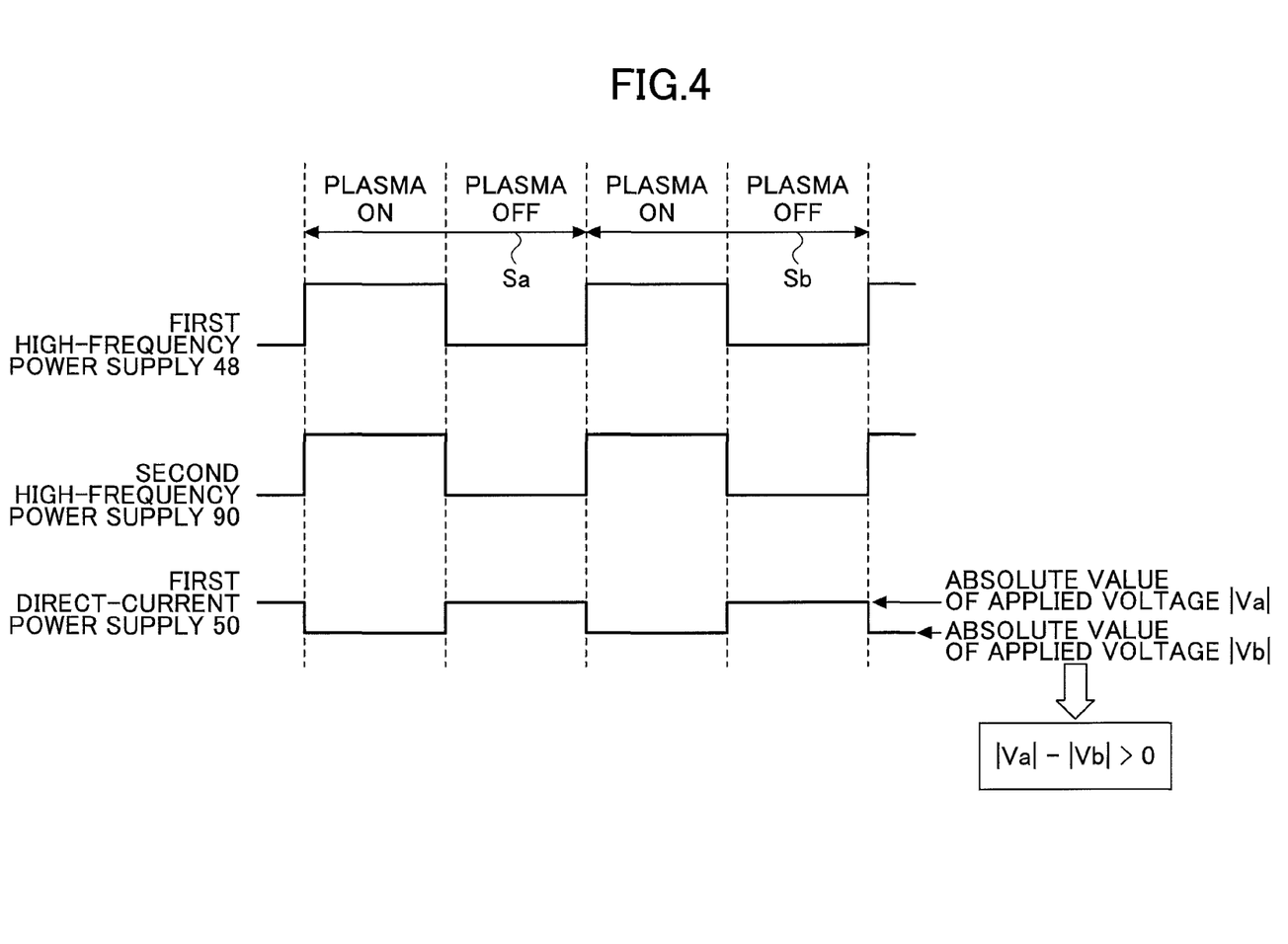
FIG. 4 is a timing chart indicating the states of a first high-frequency power supply, a second high-frequency power supply, and a first direct-current power supply in the plasma etching method according to an embodiment of the present invention.
Figure 5:
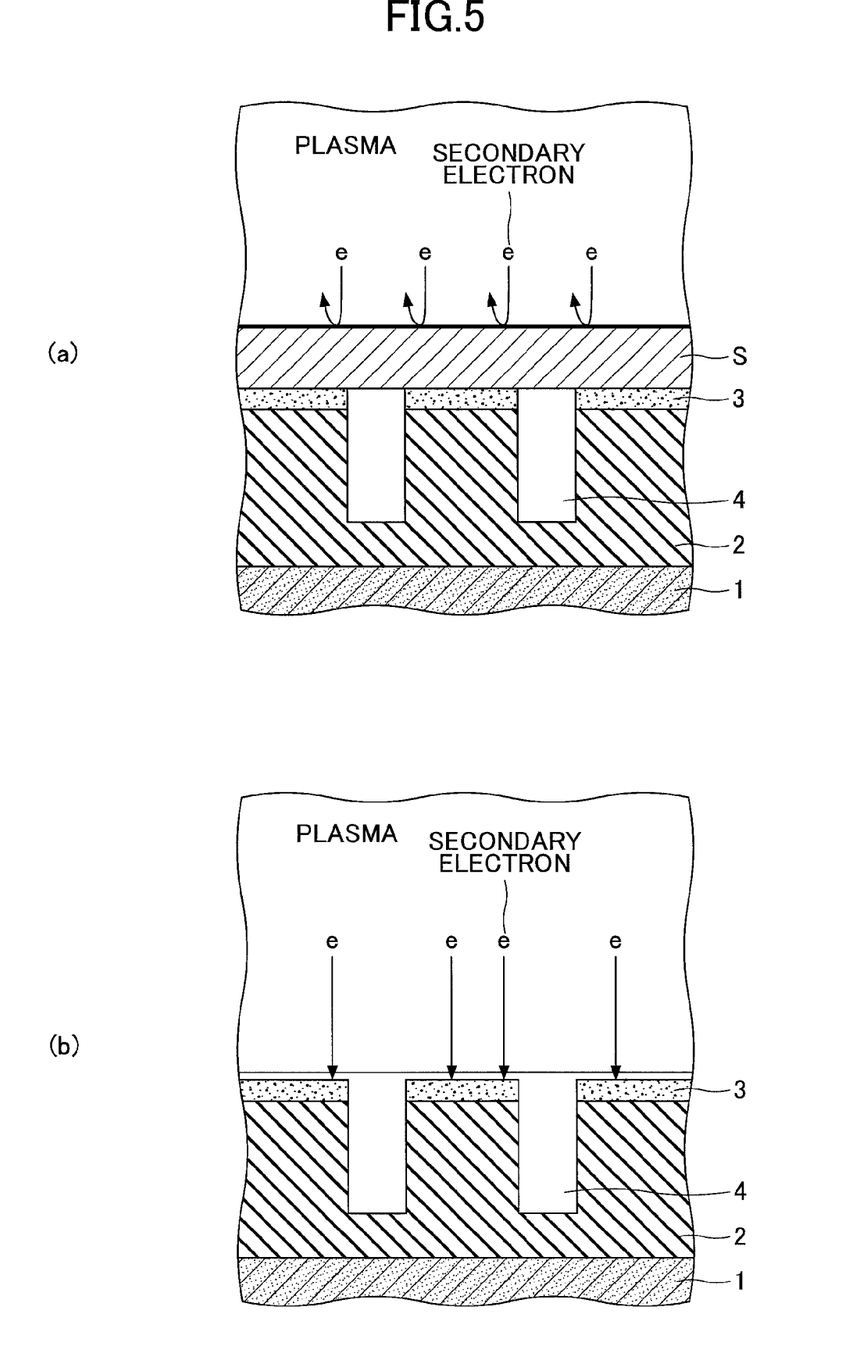
FIG. 5 is a schematic diagram illustrating the behavior of secondary electrons generated at an upper electrode by application of a negative direct-current voltage.

FIG. 4 illustrates a timing chart indicating the states of a first high-frequency power supply, a second high-frequency power supply, and a variable direct-current power supply in the plasma etching method according to an embodiment of the present invention. Furthermore, a schematic diagram illustrating the behavior of secondary electrons generated at an upper electrode by application of a negative direct-current voltage in the presence of a thick plasma sheath is shown in (a) of FIG. 5, and a schematic diagram illustrating the behavior of secondary electrons generated at an upper electrode by application of a negative direct-current voltage in the absence of a plasma sheath is shown in (b) of FIG. 5.

As illustrated in FIG. 4, in the second etching process of the plasma etching method, the first high-frequency power supply 48 for plasma generation is alternately turned on and off, and the second high-frequency power supply 90 for second bias application is alternately turned on and off in synchronization with it. That is, a state in which a plasma (glow plasma) by the first high-frequency power supply 48 is generated (PLASMA ON) and a state where a glow plasma has disappeared (PLASMA OFF) are alternately repeated in a pulsed manner.

As described above, when a plasma is formed, a negative direct-current voltage is applied from the variable direct-current power supply 50 to the upper electrode 34. Therefore, positive ions in the plasma collide with the upper electrode 34, so that secondary electrons are generated near the upper electrode 34. The generated secondary electrons are accelerated vertically downward in a process space because of the potential difference between the value of the direct-current voltage applied from the variable direct-current power supply 50 to the upper electrode 34 and a plasma potential. At this point, the secondary electrons (fast electrons) are emitted to the semiconductor wafer W by causing the polarity, voltage value, and current value of the variable direct-current power supply 50 to be as desired. As illustrated in (a) of FIG. 5, however, the plasma sheath of a plasma generated by the first high-frequency power supply 48 and a plasma sheath generated by the second high-frequency power supply 90 for bias application are combined to form a thick plasma sheath S during a period of PLASMA ON in which a plasma process progresses. Therefore, secondary electrons are reflected by the plasma sheath S. On the other hand, as illustrated in (b) of FIG. 5, the first high-frequency power supply 48 and the second high-frequency power supply 90 are both off during a period of PLASMA OFF. Therefore, the plasma sheath S disappears almost completely, so that it is possible to cause secondary electrons (fast electrons) to easily reach the semiconductor wafer W.

Furthermore, in this embodiment, as illustrated in FIG. 4, a negative direct-current voltage is applied from the variable direct-current power supply 50 to the upper electrode 34 in accordance with the on/off of the plasma so that the absolute value of the applied voltage is greater in a period of PLASMA OFF than in a period of PLASMA ON. For example, in FIG. 4, the relationship between the absolute value $|Va|$ of the voltage applied from the variable direct-current power supply 50 during a period of PLASMA OFF and the absolute value $|Vb|$ of the voltage applied from the variable direct-current power supply 50 during a period of PLASMA ON is $|Va|-|Vb|>0$. By applying a negative direct-current voltage so that the absolute value of the applied voltage is greater in a period of PLASMA OFF, it is possible to supply more secondary electrons into the hole.

The secondary electrons emitted and supplied by the above-described process modify the composition of the etching mask (in particular, an organic mask such as an ArF photoresist), so that the etching mask is strengthened. Accordingly, it is possible to strengthen the etching mask to a predetermined extent by controlling the amount of secondary electrons generated near the upper electrode 34 by the value of the applied voltage and the value of the applied current of the variable direct-current power supply 50 and further by controlling a voltage for accelerating the secondary electrons to the wafer. This effect of improving the plasma resistance of an etching mask is significant particularly when an organic mask of low plasma resistance, such as an ArF photoresist, is used as an etching mask.

In the second etching process, a process gas of low radical adhesion to a film to be etched, which causes a protection film to thinly adhere to the inside of the hole, is used in order to suppress necking. By the above-described process, however, it is possible to increase the plasma resistance of the etching mask (in particular, organic mask) by secondary electrons supplied into the hole. Therefore, it is possible to effectively prevent reduction in the remaining film of the etching mask in HARC etching as well.

Figure 6:
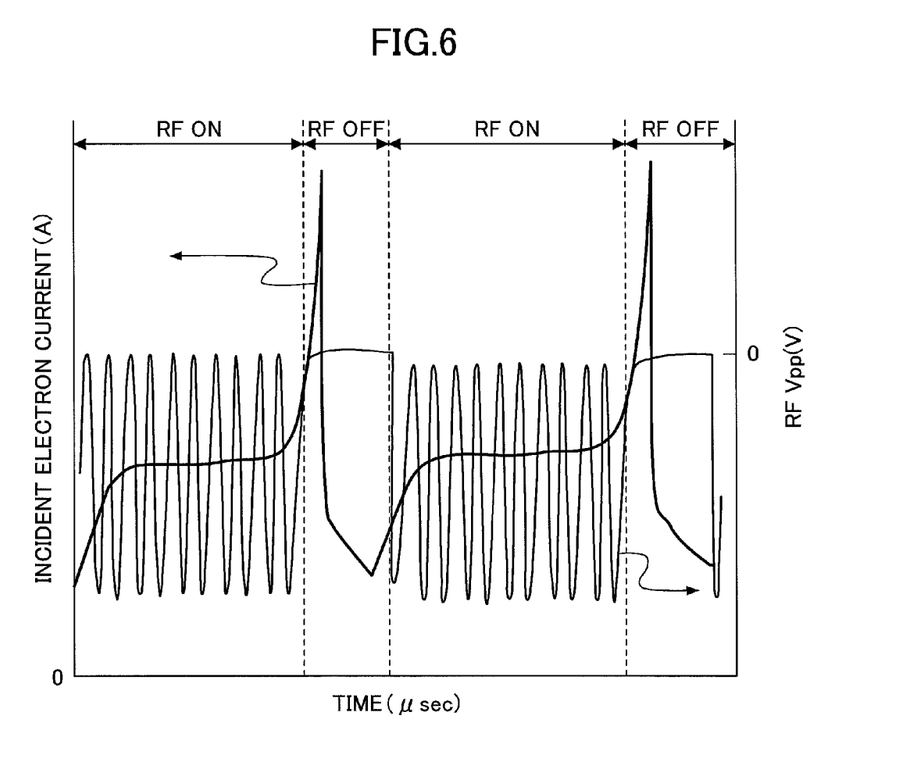
FIG. 6 is a graph for explaining the relationship between the on/off of a plasma caused by the on/off of high-frequency electric power and an incident electron current (A) to a semiconductor wafer W, which is an index of the amount of electrons incident on the semiconductor wafer W.

FIG. 6 illustrates a graph for explaining the relationship between the on/off of a plasma caused by the on/off of high-frequency electric power and an incident electron current (A) to the semiconductor wafer W, which is an index of the amount of electrons incident on the semiconductor wafer W. As illustrated in FIG. 6, the incident electron current increases in a period of PLASMA OFF set by turning off high-frequency (RF) electric power, thus showing that more electrons are supplied in a period of PLASMA OFF than in a period of PLASMA ON.

The direct-current voltage applied during a period of PLASMA ON may be set to a value commensurate to a plasma to be formed, which is, for example, approximately 0 to −300 V. Furthermore, the direct-current voltage applied during a period of PLASMA OFF may have a greater absolute value than in a period of PLASMA ON, and is preferably smaller in absolute value than −2000 V in view of apparatus durability.

The period of PLASMA OFF is preferably less than or equal to 50 μsec. If the period of PLASMA OFF exceeds 50 μsec, a time that does not contribute to etching increases to reduce efficiency. Furthermore, a period from PLASMA OFF to next PLASMA OFF, that is, a pulse interval, which is preferably shorter because that increases the number of times secondary electrons flow into the semiconductor wafer W and thus increases the amount of secondary electrons supplied into the hole, may be, for example, 50 μsec (20 kHz), 100 μsec (10 kHz) or the like. Furthermore, the pulse interval may be gradually reduced. For example, in FIG. 4, a preceding pulse interval Sa and a subsequent pulse interval Sb are equal. That is, in FIG. 4, the pulse interval is controlled to satisfy the relationship of Sa=Sb. Alternatively, the subsequent pulse interval Sb may be shorter than the preceding pulse interval Sa, that is, the pulse interval may be controlled to the relationship of Sa>Sb. Furthermore, the pulse interval may also be controlled to satisfy Sa=Sb and gradually reduced so as to satisfy the relationship of Sa>Sn at a subsequent pulse n (n is a natural number). Furthermore, the ratio of a period of PLASMA ON to the period from PLASMA OFF to subsequent PLASMA OFF may be, for example, 70%.

The direct-current voltage from the variable direct-current power supply 50 may be off during a period of PLASMA ON and on during a period of PLASMA OFF.

Furthermore, in this embodiment, a higher flow rate of argon gas is preferable because this makes it possible to increase the amount of second electrons generated near the upper electrode 34. The flow rate of argon gas may be, for example, 275 sccm or 550 sccm. As described above, usually, the amount of secondary electrons supplied into the hole tends to be insufficient in a high aspect ratio area. Therefore, it is preferable to increase the amount of secondary electrons generated near the upper electrode 34 by increasing the flow rate of argon gas as the plasma etching process progresses.

In the process using the second process gas as well, usually, high-frequency electric power for plasma generation of a frequency of 27 to 100 MHz, for example, 40 MHz, is applied from the first high-frequency power supply 48. Furthermore, high-frequency electric power for drawing ions of a frequency of 400 kHz to 13.56 MHz, for example, 3 MHz, is applied from the second high-frequency power supply 90.

Accordingly, as in this embodiment, first, the mask selection ratio is increased using highly adhesive radicals in the first etching process of the plasma etching method. Then, in the second etching process, necking is suppressed using radicals less adhesive than in the first etching process. At this time, a period of PLASMA ON and a period of PLASMA OFF are alternately formed in a pulsed manner, and a negative direct-current voltage is applied in synchronization with the on/off of a plasma so that the absolute value of the applied voltage is greater in the period of PLASMA OFF than in the period of PLASMA ON, so as to effectively prevent reduction in the mask remaining film. In this embodiment, because necking is reduced, it is possible to prevent a decrease in the etch rate as well. This makes it possible to ensure a bottom CD (Btm CD), which is the CD value of the bottom of the hole. That is, it is possible to provide a plasma etching method capable of achieving a hole having a good vertical shape and a high aspect ratio.

This embodiment is not limited to the first etching process and the second etching process, and may include a third etching process. For example, a third etching process using a third process gas, which is between the first process gas and the second process gas in terms of radical adhesion, may be included between the above-described first etching process and second etching process.

First Embodiment

Next, a description is given of an experiment by which effects of the method of this embodiment were confirmed.

An object of processing having an oxide film deposited on a silicon substrate, having a nitride film and an oxide film successively stacked thereon as a hard mask, and having Poly-Si further stacked was used. A sample having Poly-Si and the hard mask etched in advance (a punch step) was prepared, and plasma etching was performed under the etching conditions illustrated in detail below.
(First Step (the Above-Described First Etching Process))
Etching Gas: $C_4F_6/Ar/O_2$=80/400/60 sccm
Pressure: 20 mTorr
First High-Frequency Power Supply Output: 1700 W
Second High-Frequency Power Supply Output: 6600 W
High-Frequency Power Supply Pulse Interval: 10 kHz (100 μsec)
Direct-Current Voltage from Variable Direct-Current Power Supply: −150 V (during PLASMA ON), −500 V (during PLASMA OFF)

Etching Time: 180 sec
(Second Step (the Above-Described Third Etching Process))
Etching Gas: $C_4F_6/C_4F_8/Ar/O_2$=40/40/400/50 sccm
Pressure: 20 mTorr
First High-Frequency Power Supply Output: 1700 W
Second High-Frequency Power Supply Output: 6600 W
High-Frequency Power Supply Pulse Interval: 10 kHz (100 μsec)
Direct-Current Voltage from Variable Direct-Current Power Supply: −150 V (during PLASMA ON), −600 V (during PLASMA OFF)
Etching Time: 400 sec (just etch)
(Third Step (the Above-Described Second Etching Process))
Etching Gas: $C_4F_8/Ar/O_2$=80/550/37 sccm
Pressure: 20 mTorr
First High-Frequency Power Supply Output: 1700 W
Second High-Frequency Power Supply Output: 6600 W
High-Frequency Power Supply Pulse Interval: 20 kHz (50 μsec)
Direct-Current Voltage from Variable Direct-Current Power Supply: −150 V (during PLASMA ON), −1000 V (during PLASMA OFF)
Etching Time: 180 sec (overetch)

At this point, as a comparative example, plasma etching was performed in the same process as in the first embodiment except that the direct-current voltage from the variable direct-current power supply was made constant (−150 V) in Third Step (the above-described second etching process).

Figure 7:
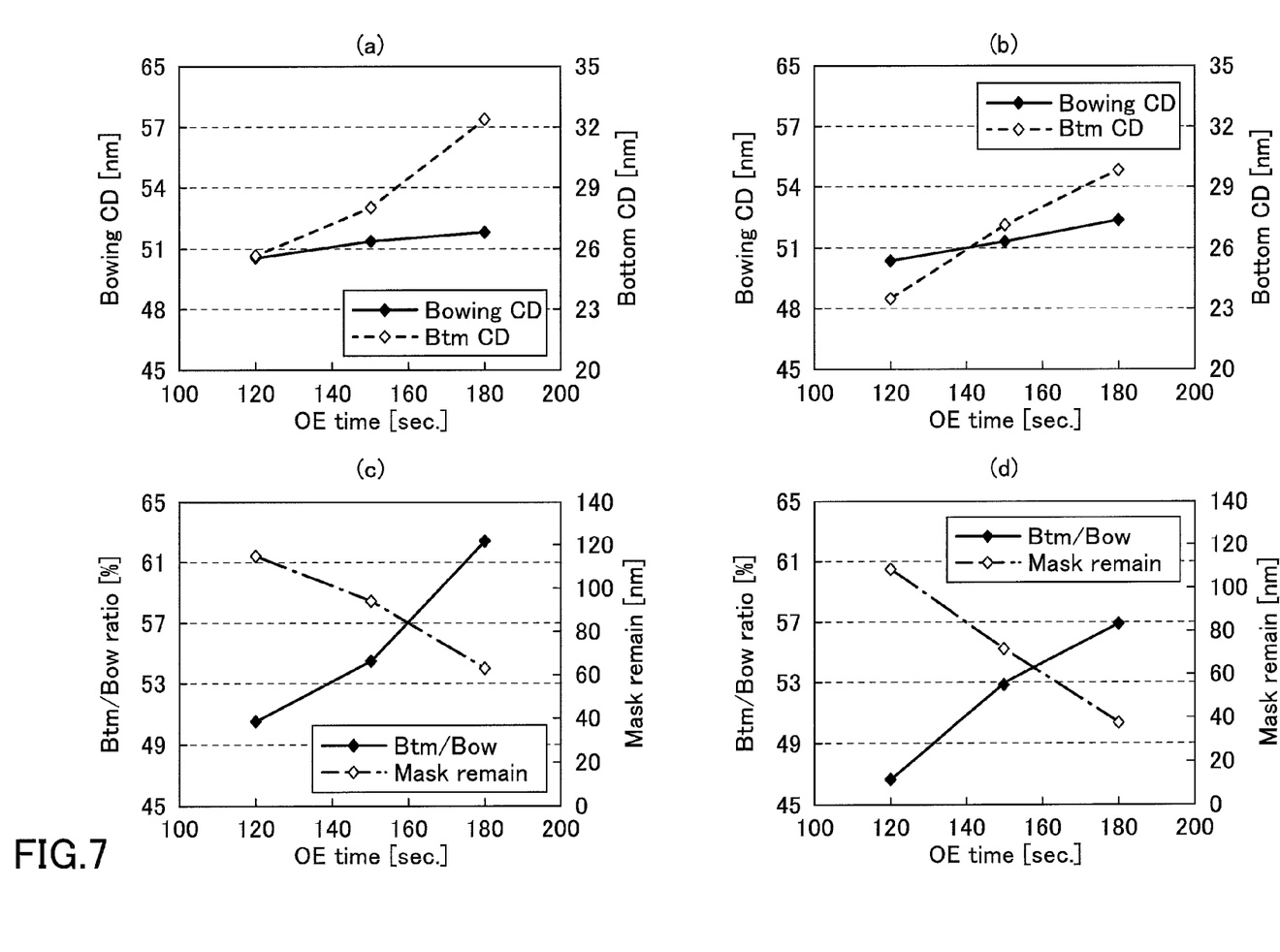
FIG. 7 is a schematic diagram for explaining the sidewall shape of a contact hole after the plasma etching method according to an embodiment of the present invention.

FIG. 7 illustrates diagrams for illustrating the shape of a contact hole after the plasma etching methods of the first embodiment and the comparative example. Here, (a) of FIG. 7 and (c) of FIG. 7 are diagrams after the first embodiment, and (b) of FIG. 7 and (d) of FIG. 7 are diagrams after the comparative example.

Comparing (a) of FIG. 7 and (b) of FIG. 7, the bowing CD is substantially the same in the plasma etching methods of the first embodiment and the comparative example. It is shown, however, that use of the method of the first embodiment causes the bottom CD to become much larger over the same etching time. That is, it is shown that it is possible to ensure the bottom CD and provide a contact hole with a good vertical shape while controlling the bowing CD to substantially the same level. The term "bowing CD" refers to the diameter of a part widened most by bowing inside the contact hole. Furthermore, the ratio of the bowing CD and the bottom CD (Btm/Bow ratio) is illustrated in (c) of FIG. 7 and (d) of FIG. 7 in order to determine etching shapability with more accuracy. The comparison of (c) of FIG. 7 and (d) of FIG. 7 also shows that use of the method of the first embodiment made it possible to ensure the bottom CD while controlling the bowing CD. Furthermore, the amount of a remaining film of the Poly-Si mask is greater in the method of the first embodiment, which supplies a larger number of secondary electrons onto a semiconductor wafer, than in the method of the comparative example.

Second Embodiment

Plasma etching was performed in the same process as in the first embodiment except that the recipe of Third Step (the above-described second etching process) in the first embodiment was changed. The specific etching conditions are illustrated below.
(First Step (the Above-Described First Etching Process))
Etching Gas: $C_4F_6/Ar/O_2$=80/400/60 sccm
Pressure: 20 mTorr
First High-Frequency Power Supply Output: 1700 W
Second High-Frequency Power Supply Output: 6600 W
High-Frequency Power Supply Pulse Interval: 10 kHz (100 μsec)
Direct-Current Voltage from Variable Direct-Current Power Supply: −150 V (during PLASMA ON), −500 V (during PLASMA OFF)
Etching Time: 180 sec
(Second Step (the Above-Described Third Etching Process))
Etching Gas: $C_4F_6/C_4F_8/Ar/O_2$=40/40/400/50 sccm
Pressure: 20 mTorr
First High-Frequency Power Supply Output: 1700 W
Second High-Frequency Power Supply Output: 6600 W
High-Frequency Power Supply Pulse Interval: 10 kHz (100 μsec)
Direct-Current Voltage from Variable Direct-Current Power Supply: −150 V (during PLASMA ON), −600 V (during PLASMA OFF)
Etching Time: 400 sec (just etch)
(Third Step (the Above-Described Second Etching Process))
Etching Gas: $C_4F_8/Ar/O_2$=100/550/37 sccm
Pressure: 20 mTorr
First High-Frequency Power Supply Output: 1700 W
Second High-Frequency Power Supply Output: 6600 W
High-Frequency Power Supply Pulse Interval: 20 kHz (50 μsec)
Direct-Current Voltage from Variable Direct-Current Power Supply: −150 V (during PLASMA ON), −1000 V (during PLASMA OFF)
Etching Time: 180 sec (overetch)

Figure 8:
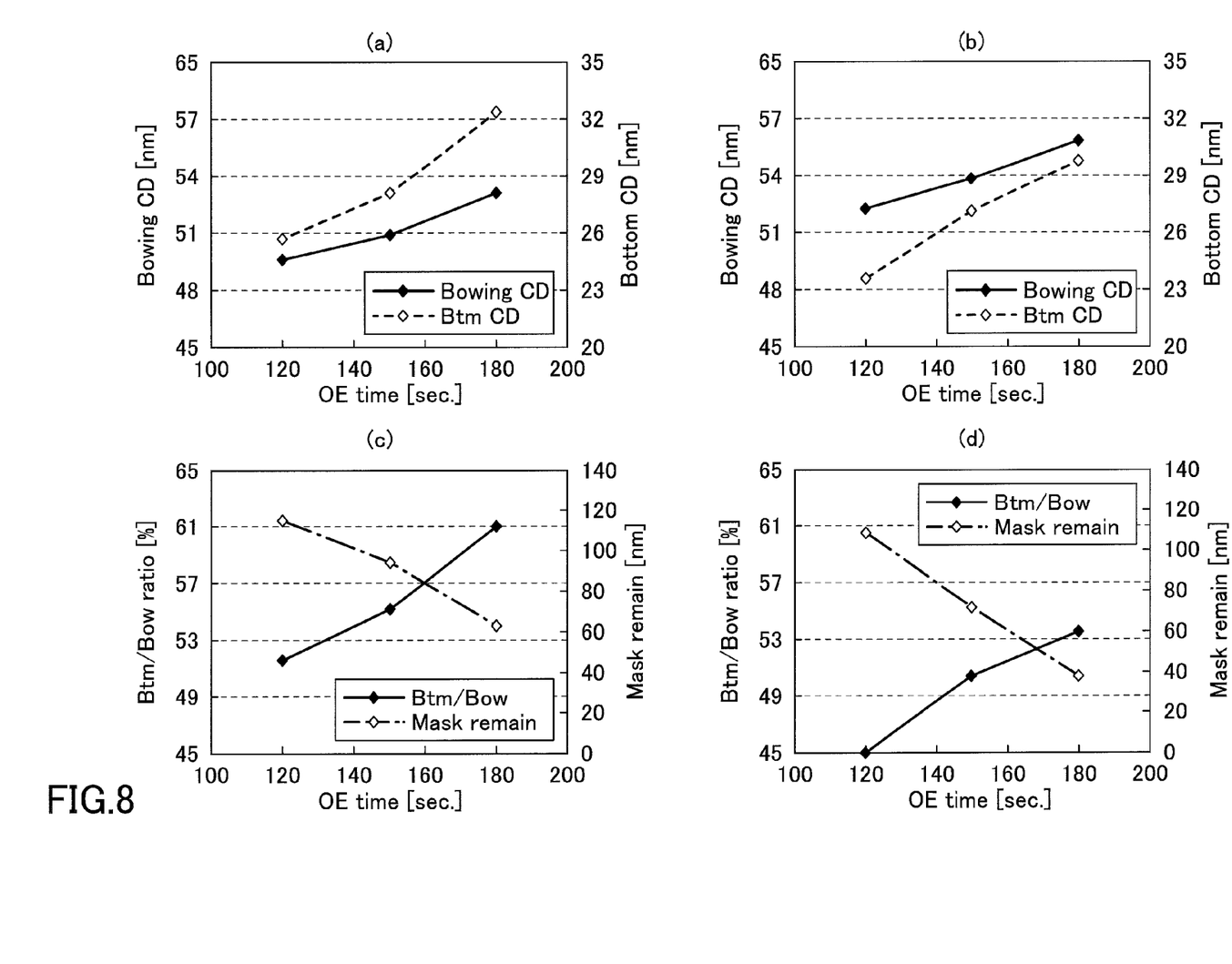
FIG. 8 is another schematic diagram for explaining the sidewall shape of a contact hole after the plasma etching method according to an embodiment of the present invention.

FIG. 8 illustrates diagrams for illustrating the shape of a contact hole after the plasma etching methods of the second embodiment and a comparative example. Here, (a) of FIG. 8 and (c) of FIG. 8 are diagrams after the second embodiment, and (b) of FIG. 8 and (d) of FIG. 8 are diagrams after the comparative example.

The comparison of (a) of FIG. 8 and (b) of FIG. 8 shows that the bowing CD is significantly reduced in the plasma etching method of the second embodiment compared with the plasma etching method of the comparative example. Furthermore, it is shown that use of the method of the second embodiment causes the bottom CD to become much larger over the same etching time. That is, it is shown that it is possible to ensure the bottom CD and provide a contact hole with a good vertical shape while controlling the bowing CD. Furthermore, the comparison of (c) of FIG. 8 and (d) of FIG. 8 also shows that it was possible to ensure the bottom CD while controlling the bowing CD. Furthermore, it is shown that the amount of a remaining film of the Poly-Si mask is greater in the method of the second embodiment, which supplies a larger number of secondary electrons onto a semiconductor wafer, than in the method of the comparative example.

Third Embodiment

In this embodiment, as described above, first, the mask selection ratio is increased using highly adhesive radicals as the first etching process of the plasma etching method. Then, as the second etching process, necking is suppressed using radicals less adhesive than in the first etching process. At this time, a period of PLASMA ON and a period of PLASMA OFF are alternately formed in a pulsed manner, and a negative direct-current voltage is applied in synchronization with the on/off of a plasma so that the absolute value of the applied voltage is greater in the period of PLASMA OFF than in the period of PLASMA ON, so as to effectively prevent reduction in the mask remaining film.

Figure 9:
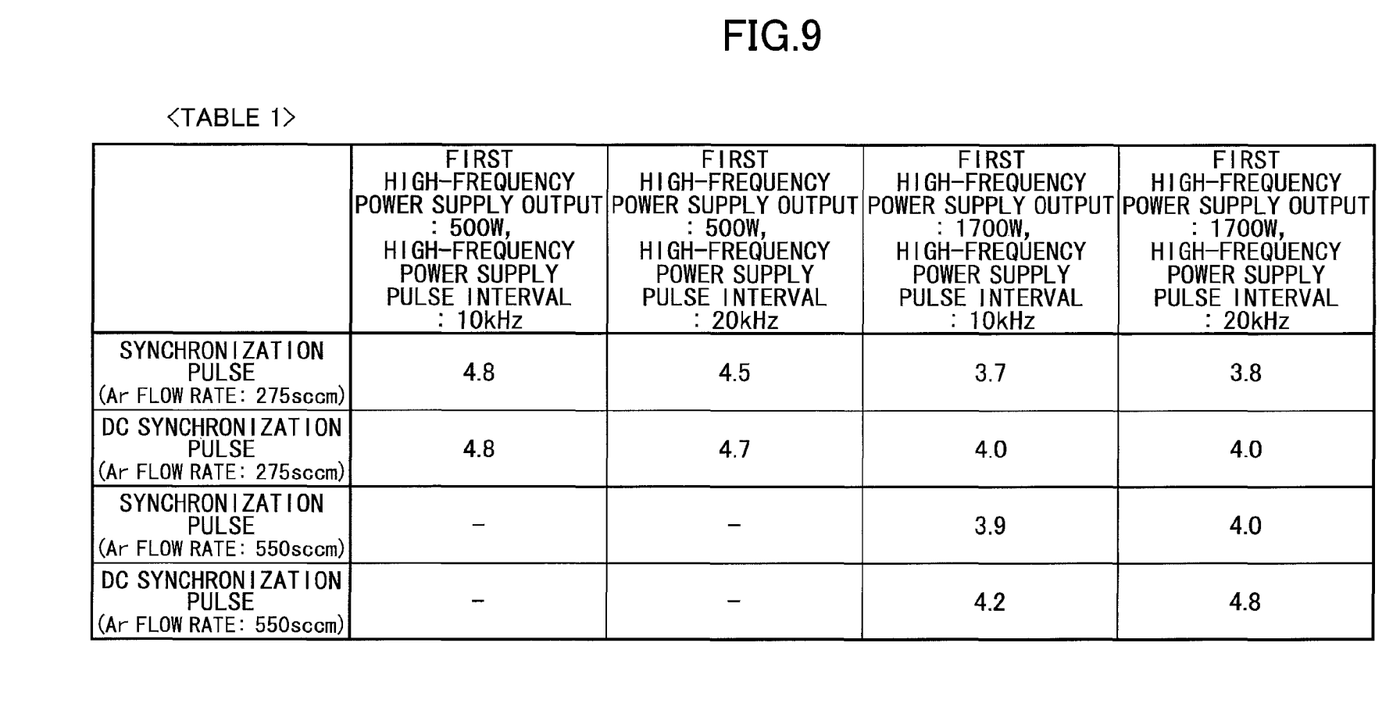
FIG. 9 is a table (Table 1) illustrating the relationship between the flow rate of argon gas and the pulse interval of a high-frequency power supply.

A description is given, using Table 1 of FIG. 9, of an experiment by which the effect of a high flow rate of argon gas and a short pulse interval of a high-frequency power supply was confirmed in the second etching process at this time.

Table 1 illustrates a mask selection ratio under each etching condition. The term "DC synchronization pulse" in Table 1 refers to etching in the case of causing a period of PLASMA ON and a period of PLASMA OFF to be alternately formed in a pulsed manner and applying a negative direct-current voltage to the upper electrode in synchronization with the on/off of a plasma so that the absolute value of the applied voltage is greater in the period of PLASMA OFF than in the period of PLASMA ON. Furthermore, the term "synchronization pulse" refers to etching in the case of causing a period of PLASMA ON and a period of PLASMA OFF to be alternately formed in a pulsed manner with the direct-current voltage from the variable direct-current power supply being constant.

Usually, increasing the output of a high-frequency power supply for plasma generation makes it possible to increase an etch rate, but causes a decrease in the mask selection ratio. Table 1 shows, however, that use of the DC synchronization pulse has succeeded in suppressing a decrease in the mask selection ratio. This is because the etching mask has been modified and strengthened by a large amount of secondary electrons supplied by the use of the DC synchronization pulse.

Furthermore, Table 1 shows that an increase in the flow rate of argon gas also increases the mask selection ratio. This is because the increase in the flow rate of argon gas has increased the amount of secondary electrons generated at (near) the upper electrode.

Furthermore, Table 1 shows that reduction in the pulse interval of the high-frequency power supply increases the mask selection ratio in the case where the output of the first high-frequency power supply is 1700 W. This is because an increase in the number of times secondary electrons are injected in a state where a glow plasma has disappeared has increased the amount of secondary electrons supplied into a contact hole.

A description is given above of plasma etching methods according to embodiments of the present invention. Plasma etching methods according to the present invention, however, are not limited to the above-described embodiments, and may be varied in various manners. For example, a plasma etching apparatus that carries out the present invention is not limited to the one illustrated in the above-described embodiments by way of example, and may be one whose lower electrode is provided with a single high-frequency power supply for plasma generation, for example. Furthermore, while a direct-current voltage from the variable direct-current power supply is applied at the time of plasma etching in the above-described embodiments, this is optional. Furthermore, the method of causing a period of PLASMA ON and a period of PLASMA OFF to be alternately formed may also be applied to the first etching process and the third etching process of the above-described embodiments.

The present international application claims priority based on Japanese Patent Application No. 2011-169296, filed on Aug. 2, 2011, and priority based on U.S. Provisional Application No. 61/523,434, filed on Aug. 15, 2011, the entire contents of all of which are incorporated herein by reference.

DESCRIPTION OF THE REFERENCE NUMERALS

1 Si substrate
2 insulating film
3 etching mask
4 hole
5 protection film
10 chamber (processing container)
16 susceptor (lower electrode)
34 upper electrode
46 first matching device
48 first high-frequency power supply
50 first direct-current power supply
66 process gas supply source
84 evacuation unit
88 second matching device
90 second high-frequency power supply
95 power supply controller
100 control part
102 storage part
W wafer (object of processing)

The invention claimed is:

1. A plasma etching method using a plasma etching apparatus, the plasma etching apparatus including a lower electrode that operates as a base for placing an object of processing and an upper electrode placed to face the lower electrode, the plasma etching method comprising:
   a first etching step of performing plasma etching using a first process gas including a fluorocarbon gas; and
   a second etching step of performing the plasma etching using a second process gas including a fluorocarbon gas, wherein adhesion of a radical of the second process gas to the object of processing is less than adhesion of a radical of the first process gas to the object of processing,
   wherein while alternately repeating a first condition of turning on high-frequency electric power for plasma generation and a second condition of turning off the high-frequency electric power, the second etching step applies a negative direct-current voltage to the upper electrode so that an absolute value of the applied voltage is greater in a period of the second condition than in a period of the first condition, and
   wherein the plasma etching method further comprises:
   a third etching step of performing the plasma etching using a third process gas including a fluorocarbon gas between the first etching step and the second etching step,
   wherein adhesion of a radical of the third process gas is less than the adhesion of the radical of the first process gas to the object of processing and is more than the adhesion of the radical of the second process gas to the object of processing.

2. The plasma etching method as claimed in claim 1, wherein the plasma etching is performed while gradually decreasing an interval of the period of the second condition.

3. The plasma etching method as claimed in claim 1, wherein the fluorocarbon gas included in the first process gas is $C_4F_6$, and
   the fluorocarbon gas included in the second process gas is $C_4F_8$.

4. The plasma etching method as claimed in claim 1, wherein a silicon oxide film is etched using a Poly-Si layer as a mask.

* * * * *